United States Patent [19] [11] Patent Number: 4,860,509
Laaly et al. [45] Date of Patent: Aug. 29, 1989

[54] PHOTOVOLTAIC CELLS IN COMBINATION WITH SINGLE PLY ROOFING MEMBRANES

[76] Inventors: Heshmat O. Laaly, 9037 Monte Mar Dr., Los Angeles, Calif. 90035; Edward J. Stevenson, 2970 Avacado Ct., Newbury Park, Calif. 91320

[21] Appl. No.: 50,966

[22] Filed: May 18, 1987
(Under 37 CFR 1.47)

[51] Int. Cl.[4] .............................................. E04D 13/18
[52] U.S. Cl. ................................. 52/173 R; 136/245; 136/251
[58] Field of Search ....................... 136/251; 52/173 R

[56] References Cited
U.S. PATENT DOCUMENTS

| | | | |
|---|---|---|---|
| 4,485,264 | 11/1984 | Izu et al. | 136/244 |
| 4,537,838 | 8/1985 | Jetter et al. | 429/9 |
| 4,574,160 | 3/1986 | Cull et al. | 136/245 |
| 4,636,578 | 1/1987 | Feinberg | 136/251 |
| 4,636,579 | 1/1987 | Hanak et al. | 136/245 |
| 4,674,244 | 6/1987 | Francovitch | 52/173 R |

Primary Examiner—Aaron Weisstuch
Attorney, Agent, or Firm—Fulwider, Patton, Lee & Utecht

[57] ABSTRACT

A combination form of flexible roofing material including a reinforced single-ply membrane base for being adhered to the roof substrate. On the base is laminated a structurally flexible layer of solar cells encapsulated and sealed in a flexible intermediate layer of solar radiation transparent plastic protected by a cover layer of weather-proof solar transparent plastic. The roofing is constructed for being manufactured in elongate sheets, rolled up for transport to the site and installed by conventional methods including sealing to adjacent sheets of similar single-ply membrane material which may or may not incorporate solar cells. This is continued until the roof covering is complete. Examples are given for reinforced plastic sheet, modified bituminous sheet, and elastomeric sheet roofing materials as well as for a wide variety of solar cells materials together with methods for fabricating these materials into the roofing system disclosed.

7 Claims, 3 Drawing Sheets

FIG. 2
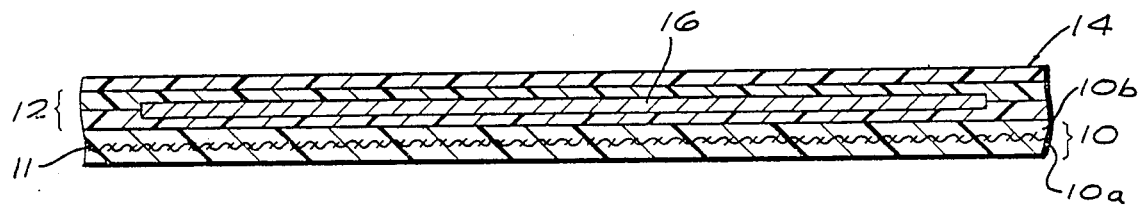
FIG. 3
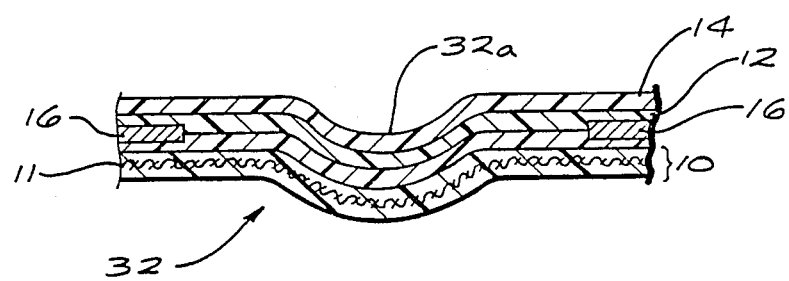
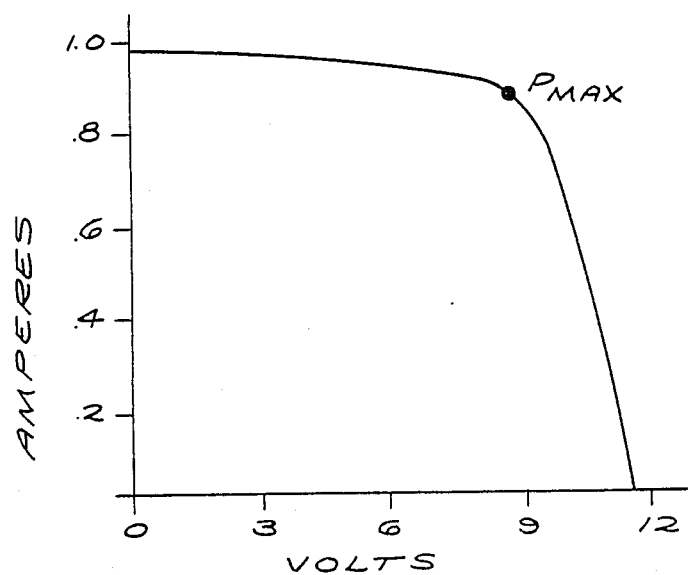
FIG. 4

PHOTOVOLTAIC CELLS IN COMBINATION WITH SINGLE PLY ROOFING MEMBRANES

GENERAL STATEMENT OF THE INVENTION

This invention relates to multi-functional roofing systems which combine a photovoltaic solar collection feature with roofing materials that have the primary purpose of providing environmental protection to the host structure. The photovoltaic solar cells as employed herein described have the function of generating electricity. This invention is primarily directed to an application which employs single-ply roofing material, although other types of roofing materials could be used if desired.

A layer of photovoltaic solar cells is laminated to a base of flexible roofing material, which roofing material is commonly termed a membrane. These solar cells, after lamination, are further encapsulated and sealed in a flexible intermediate layer of solar radiation transparent plastic, which in turn is protected by a cover layer of weather-proof solar radiation transparent plastic. The size and shape of the solar cells, and the pattern in which they are laminated to the roofing material base, is arranged in a manner which allows continued flexibility of the roofing material after the said lamination takes place.

The roofing material, in conjunction with the encapsulated solar cells, is applied to the roofs of building structures, generally by adhering it to the roof substructure, i.e., roof deck wood, concrete, corrugated steel, galvanized steel panels or any of the commonly used insulation boards that are positioned over roof decks.

The roofing material is manufactured in elongated sheets which is arranged in rolls up for transport to the construction site. Installation is accomplished through a variety of mechanical fastening devices, adhesives means, torching or any other methods which are conventionally employed in the roofing industry. Adjacent sheets of roofing material are commonly sealed together where they adjoin. Adjoining sheets may or may not incorporate solar cells.

Examples of roofing materials to which solar cells are or may be laminated, include reinforced flexible thermoplastic sheet, modified bituminous sheet, and vulcanized or non-vulcanized elastomeric sheet. This disclosure covers the incorporation of a variety of solar cells into the above exampled classes of roofing materials, including their fabrication in the manufacturing plants and their installation into roofing systems as a whole.

BACKGROUND AND SUMMARY OF ROOFING SYSTEMS

There are well over 500 roofing materials and systems currently in use. The purpose of all of them is to prevent rain water from entering the building structure. The classical roofing materials, such as clay tiles, cedar and asphalt shingles, and metallic panels such as galvanized steel, copper and tin sheets, have all been and are being used successfully for sloping roofs. The bituminous built-up roofing system consists of three or four layers of asphalt (hot melt or emulsion) in conjunction with layers of bitumens saturated or not saturated roofing felts, and a topping of protective gravel. Such a coating was common and for the most part the only roofing system choice for the construction of flat roofs during the past 100 years.

However, technological advances have brought about a new generation of roofing materials consisting of single-ply roofing membranes. These membranes are basically classified into four major groups, as follows:

1. Modified Bitumens: are composite sheets consisting of bitumen, modifiers (APP, SBS) and/or reinforcement such as plastic film, polyester mats, fiberglass, felt or fabrics. The modifying compounds impart flexibility and elasticity while improving cohesive strength and resistance to flow at high temperatures. The reinforcement may be laminated to one surface or embedded within the modified bitumen.

2. Thermoplastics (PVC, ethylene interpolymer): are similar to non-vulcanized elastomers in that there is no cross-linking of the molecules. They can be repeatedly softened when heated and hardened when cooled. PVC membranes may be welded together with heat or solvents and will develop bond strengths which equal or surpass the strength of the base material.

3. Vulcanized Elastomers (EPDM, Neoprene), also referred to as thermosets: are the chemical cross linkage of polymers (chains of molecules) which occurs during the manufacturing process. A distinguishing characteristic is that it can only be bonded to itself during installation by use of an adhesive because once cured, new molecular linkages cannot be formed.

4. Non-Vulcanized Elastomers (chlorinated polyethylene, chlorosulfonated polyethylene, polyisobutylene, acrylonitrite butadiene polymer): are manufactured without any cross-linking between chains of polymer molecules. Although exposure to the elements may naturally cure some of these polymers during their lifetime, all non-vulcanized elastomers can be heat welded during initial installation.

See *Roofing Magazine*, Single Ply Systems Index, April 1986, pp. 17–42 (D & H Publications, Inc.).

All types of single-ply roofing membranes are applied in one of four ways:

1. Fully adhered to the substrate
2. Loosely laid and ballasted
3. Mechanically fastened
4. Used under insulation board as a protected membrane system.

Typical rolls of these membranes have a width as large as 10 feet and a length cut and rolled to between 30 or 100 feet. During application the membranes are usually lapped two to five inches in the machine direction and up to six inches at the end of the rolls to form a waterproof seam at the overlap. Joining is accomplished by one of the following techniques:

1. Heat, with propane torch or hot air gun (by hand, semi automatic, or self-propelled welding machines)
2. Adhesives, as with solvent, emulsion or solvent based adhesives, double-sided adhesive tapes, or pre-applied adhesive with removable release paper
3. Ultrasonic, microwave, or heat-pressure techniques.

BACKGROUND RELATING TO SOLAR ENERGY

The value of solar energy collection for supplementing or even replacing conventionally fueled systems for generating electricity has been long established. However, until recently, most of the photovoltaic based systems have not been cost effective, and because of this, they were not suitable for large-scale commercial application where another source of electric power was available. The primary cost factors in photovoltaic systems relate to: (1) the cost of manufacturing photovoltaic cells; and (2) the cost of installing and maintaining the system. Because of the traditionally low efficiency of the cells, very large arrays of cells were required in order to generate usable levels of power. These large arrays most often required heavy steel structures to support their weight and to cope with the usually high wind loads created by the array. These structures usually require substantial amounts of maintenance to keep them operational.

Recent technological advances, though, have brought about substantial increases in solar cell efficiency, while simultaneously dramatically reducing their cost. See "Special Report on Photovoltaic Cells", Kenneth Zweibel, *Chemical and Engineering News*, July 7, 1986, pages 34-48. There exists a need to employ these new cells in conjunction with a roofing system that totally eliminates any need for a special support structure for the cell array. Such a construction would open broad commercial applications for photovoltaic power generation. With such a construction, it would be literally possible to create an electric power generating plant by little more than simply unrolling the new system onto a roof. While systems have been proposed for incorporating solar cells into shingle constructions (see for example U.S. Pat. No. 4,040,867 issued to Forestieri, et al.), proposals are not known which suggest combining the new photovoltaic cells with a single ply flexible membrane.

The uniqueness of such an invention would be that it is possible to generate many thousands of watts of power without the necessity of making numerous electrical interconnections, which could involve hundreds of man hours at a job site. Such an invention could utilize arrays of thousands of solar cells, which could be interconnected at the manufacturing facility. After manufacture, the arrays could be tested at the factory prior to shipment to the job site. Thus, once the array arrived at the job site, there would be little more to do except to unroll the roofing system, seam the lap joints, fasten it down, and plug it into the structure's electrical system. If such a roofing system existed, the need for highly trained technical personnel at the job site would be obviated because of the simplicity of the installation process. The work at the site would be primarily performed by roofing personnel, as opposed to electronics specialists.

Most certainly such a invention would be multi-functional, because not only would it generate power, it would also serve a primary function of protecting the host structure from the elements. There are no other known systems which consists of very large pre-fabricated photovoltaic cell arrays encapsulated in a single-ply roofing membrane which provides environmental protection on any roofing surface including a totally flat roof.

Because sunshine has been the most destructive factor with respect to the service life of roofing materials, substantial effort and expense should be directed towards the development of protection from solar radiation. With such an invention, the traditional enemy of roofing systems could be converted into a beneficial and generous ally.

Hence, those concerned with the development and use of roofing systems in the construction industry have long recognized the need for improved roofing systems which provide environmental protection to the structure on which the roof is installed and which simultaneously collect solar energy for conversion into electrical power having the desired electrical characteristics. Further, the electrical power should be generated in sufficient magnitude for typical residential and commercial use, should be compatible with any roof configuration, should be completely electrically prefabricated during manufacture, should remain flexible after manufacture to be handled in a rolled condition for installation by roofing personnel, and should require essentially no maintenance after installation. The present system fulfills all of these needs.

SUMMARY OF THE INVENTION AND OBJECTS

This invention consists of the lamination or bonding of photovoltaic solar cells to a flexible roofing membrane. After lamination, these solar cells are encapsulated in a transparent potting material, and further protected by a transparent plastic overlay. The solar cells are electrically interconnected into arrays in order to generate electrical power which possesses the desired voltage and current characteristics.

The roofing membrane, in addition to providing a base to which the solar cells are laminated, also provides environmental protection to the structure on which it is installed. Thus, this invention represents a new and improved roofing system which incorporates in a single unit both the functions of providing protection to the host structure from the elements, and providing a solar collection system which conveniently generates electricity at no cost and with minimum maintenance expenditure.

The primary objects of the invention are as follows:

1. To provide environmental protection to the structure on which the roofing system is installed;

2. To collect solar energy and convert it into electrical power having the desired characteristics;

3. To generate usable electrical power, when installed on a typical residential and commercial structure, in a magnitude of thousands and millions of watts, respectively, since the amount of electricity generated is directly proportional to the roof surface area;

4. To be installed on roofs of any type configuration, i.e., gradual slope, sharp pitch, flat, or in any combination thereof;

5. To remain flexible after manufacture, including encapsulation of the solar cells, so that it is capable of being rolled up for transport, and being unrolled at the construction site;

6. To have all the critical electrical interconnections to the solar cells be performed at the factory under controlled conditions, as opposed to being performed at the construction site;

7. To enable installation at the construction site by relatively unskilled personnel; and 8. To require little or no maintenance after the system is installed.

BRIEF DESCRIPTION OF THE DRAWINGS

FIG. 2 is a cross-sectional view taken along the lines of 2—2 of FIG. 1.

FIG. 3 is a cross-sectional view taken along the lines of 3—3 of FIG. 1.

FIG. 4 is a graph depicting the voltage, current and power output of a typical solar cell roofing of FIG. 1.

DETAILED DESCRIPTION OF THE PREFERRED EMBODIMENTS

Figure 1:
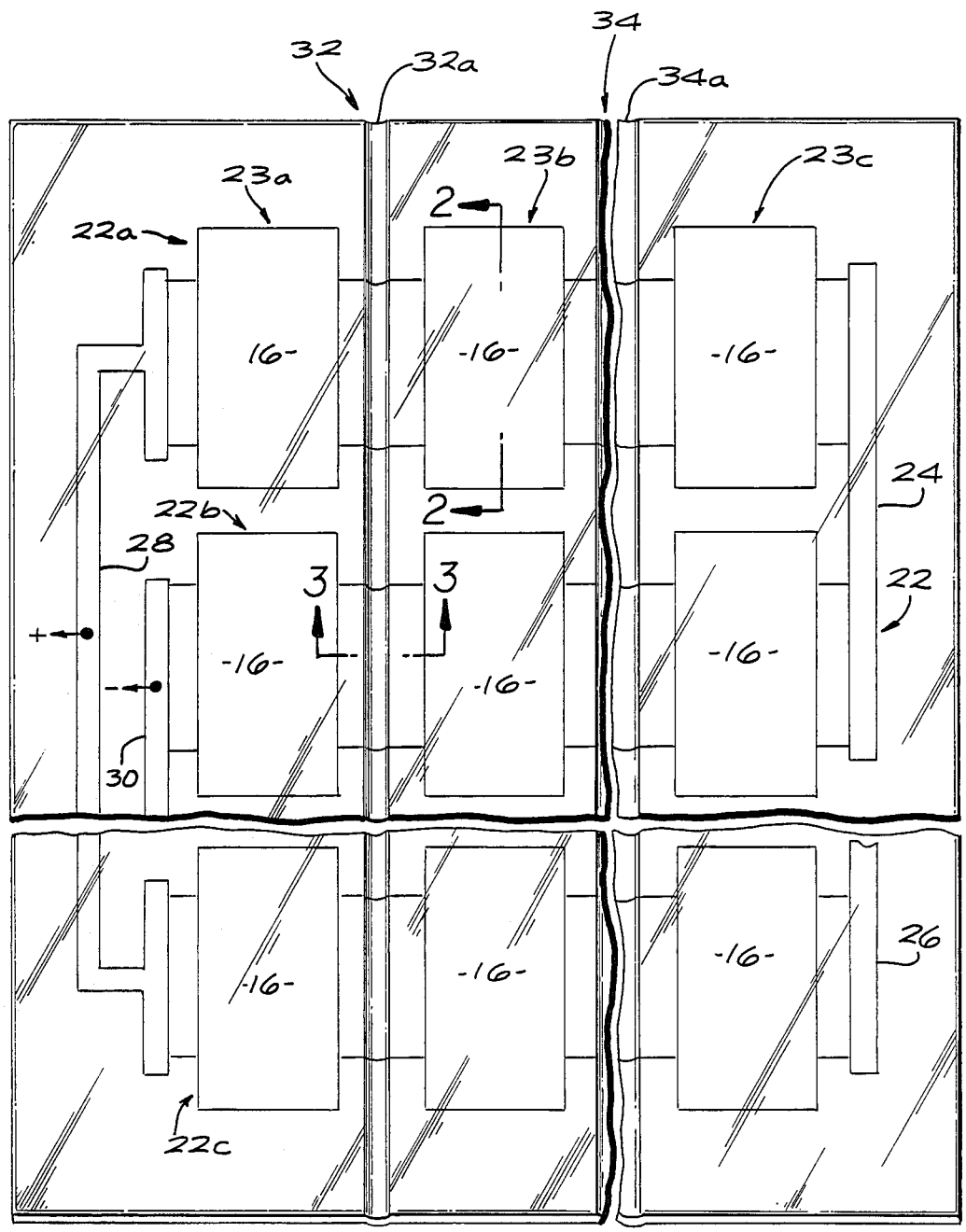
FIG. 1 is a plan view showing a single-ply solar collection roofing constructed in accordance with the present invention.
Figure 5:
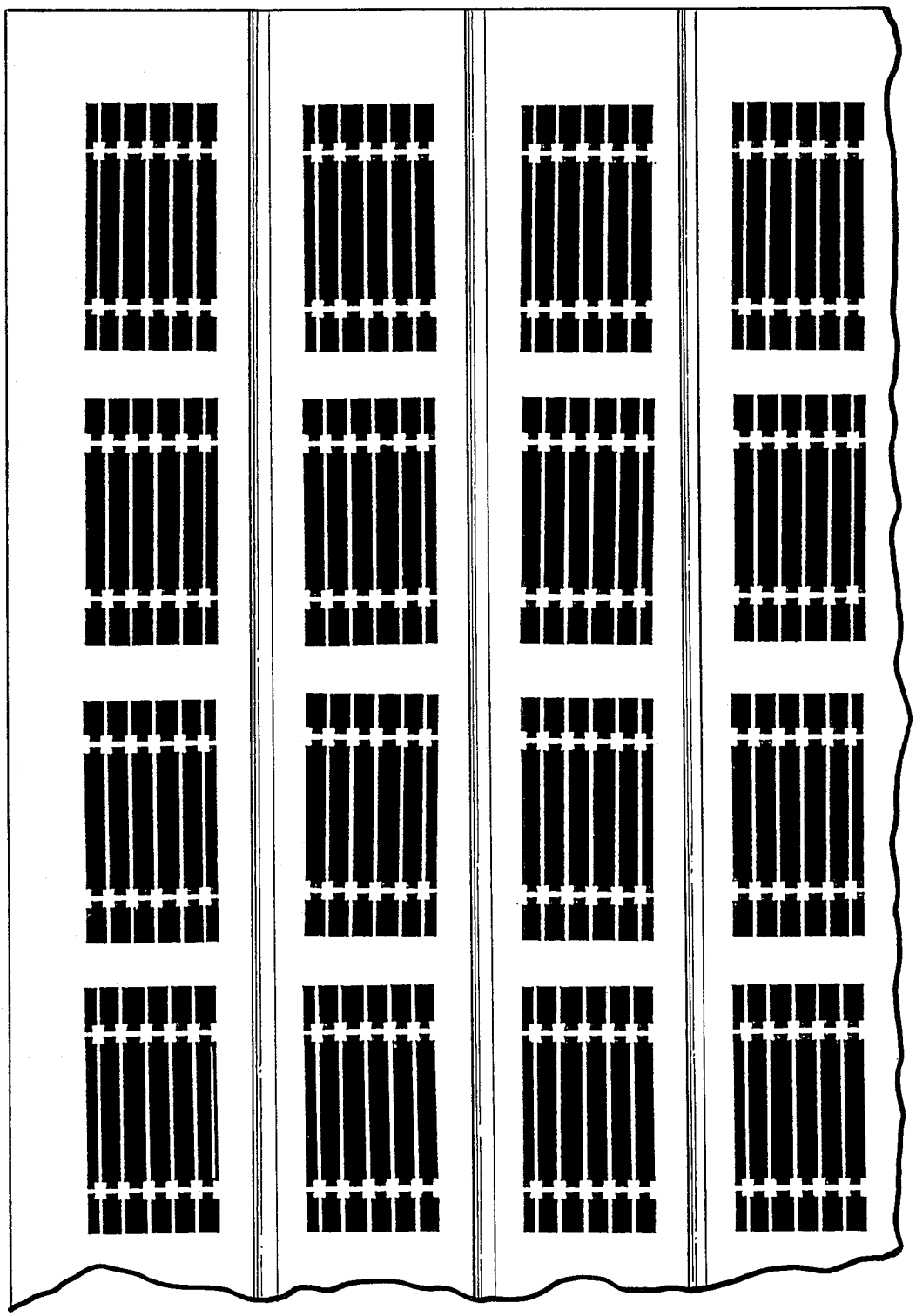

Referring now to FIGS. 1 and 2, the roofing of the present invention is shown in detail and generally includes three layers, 10, 12, and 14. Layer 10 is a base layer and consists of a single-ply membrane roofing material made of a composite of layers of thermo plastic, elastomeric, or modified bituminous roofing membrane together with fiber reinforcing. The central layer 12 includes a plurality of solar collection cells 16 and is laid over the base layer 10. The solar collection cells can be a plurality of discrete cells or a distributed system made by electroplating and are encapsulated and sealed in a plastic pottant material for protection and support. Layer 14 consists of a protective cover which is laid over the layer 12 and consists of a transparent, weatherproof plastic. The layers are fused together to form a unitary structure.

Each of these layers has to serve a number of functions, as will be explained and is therefore, made of a specifically and specially selected material to achieve all of the properties needed to cooperate with the other layers as well to form a unitary and flexible structure while encapsulating the photovoltaic cells.

A range of materials suitable for each of the layers will now be described after which examples will be given with particular reference to preferred materials of construction of the individual layers. Examples will also be given of composite constructions together with a description of the methods of making such constructions. In each case it is important that the materials be selected for cooperation so that they can be laminated together into a permanent composite and unitary roofing material which will be resistant to the elements and to delamination.

The following are definitions of the abbreviations used herein:

PVC is polyvinylchloride, a thermoplastic base material;
PVF is polyvinylfluoride, and is a thermoplastic cover material;
$PVF_2$ is polyvinylidene fluoride, a thermoplastic cover layer material;
EPDM is ethyl propylene diene (monomer) terpolymer, and serves either as an elastomeric base material or pottant;
EVA is ethylene vinyl acetate, a pottant; and
EPR is ethylene-propylene rubber.
Si is a silicon base material of a crystalline type used for photovoltaic cells;
a-Si is amorphous silicon, a solar cell material; as are the following:
$CuInSe_2$ is cuprous indium diselenide;
GaAs is gallium arsenide;
CdTe is cadmium telluride;
HgZnTe is mercury-zinc telluride; and
CdS is cadmium sulfide.

In accordance with the present invention, the reinforced single-ply membrane can be any of the standard flexible single-ply roofing materials currently receiving widespread use. In general there are three broad classes of such materials which are suitable for application of the present invention, all of which include some form of reinforcement in the form of fibrous material incorporated into the structure. These single-ply roofing materials are generally known as thermoplastic roofing membranes, elastomeric roofing membranes, and reinforced modified bituminous roofing membranes. They may or may not be reinforced.

One example of thermoplastic single-ply roofing membrane is a flexible PVC material having upper and lower layers 10a, and 10b bonding fiber reinforcement 11 between them into a sandwich. The lower layer 10a is PVC filled with carbon black while the upper layer 10b is usually colored grey to reflect heat or possibly light blue, also to reflect heat and for aesthetic appearance. The reinforcing fibers 11 are commonly fiberglass and may be woven or non-woven. The reinforcing fibers provide the dimensional stability over a wide range of temperatures. An example of such a membrane is that sold under the brand name Sucoflex ™, available from PMS/Sucoflex of Torrance, Calif. Another example of a thermoplastic membrane is that sold under the brand name Rhenofol-C available from Barra Corporation of America, West Caldwell, N.J.

An example of an elastomeric membrane in layer 10 is EDPM reinforced membrane sold under the name Hydroseal, available from American Hydrotech Inc. of Chicago, Ill.

An example of a suitable modified bituminous material is the reinforced sheet, sold under the mark Tri-Ply-4 available from Tri-Ply Inc., of Madison Heights, Mich. 48071. For more examples see below.

The selection of roofing materials for use in a given situation is a complex subject but is the same for the base layer 10 of the present invention as for roofing in general. A summary of the essential considerations and of the properties of thermoplastic, elastomeric and modified bituminous single-ply membranes is set forth in the paper by H. O. Laaly and O. Dutt entitled Single-Ply Roofing Membranes, *Canadian Building Digest*, CBD 235 issued on February 1985, and a paper presented by H. O. Laaly entitled "A Basis for Selecting Roofing Membranes", presented at the Second International Symposium on Roofing Technology, 1985, organized by NRCA, NBS, RILEM, Library of Congress catalog card 85-072090 ISBN 0-934-80900-3. The breadth of the possible selections of single-ply roofing membranes can be obtained from the Roofing Materials Guide, published semi-annually by National Roofing Contractors Association and the documents cited therein particularly:

1. ANSI/RMA IPR-3, 1985,
2. ASTM Standard for Vulcanized Rubber Sheets used in Single-Ply Roofing Membranes, and
3. ASTM D4434-85 Standard Specifications for Poly (Vinyl Chloride) Sheet Roofing. A large number of photovoltaic cell materials are available and suitable for use in the present invention. These include both those materials which are themselves flexible or, if rigid, can be subdivided and organized in a segmented way so that they can be incorporated in a multi-layer construction of materials as disclosed herein which is, at least, sequentially flexible and, after manufacture, can be bent between segments so as to be rolled up for transport without damage to the cells.

Crystalline silicon solar cells are an example of a suitable rigid material and will be disclosed in example I herein. These cells are typically 450 to 500 microns thick.

Other suitable materials include amorphous silicon or $CuInSe_2$. The latter is 4 to 5 microns thick, it is flexible, and it can be electroplated on certain types of the materials disclosed. Additional materials include GaAs, CdTe and HgZnTe and the cascade constructions CdTe/CdS and CuInSe$_2$/CdS. A discussion of solar cell technology and these materials is given in the referenced article by K. Zweibel in *Chemical & Engineering News*, July 7, 1986, pages 34–48. In general, the selection of the above materials is made on the basis of cost and efficiency and it is not critical in the present invention which of the foregoing materials is incorporated subject to the constructional constraints for flexibility.

The cells are interconnected by conductors in a known manner to produce suitble voltage and current. In the example shown, if of 4 rows, the conductors connect elements of each row in series, with the inner rows (22, shown) being connected to the outer rows by the bus bars 24, 26 at one end, and with the other ends terminating in parallel connection bus bars 28, 30 which serves to supply plus and minus polarities, as indicated.

The solar cells 16 are laid out in a suitable pattern and are encapsulated in pottant 12 which provides permanent fixation of cells in specific positions, but allows some slight displacement of each cell while providing each cell with cushioned support. The pottant serves to encapsulate the cells and seal them from the effects of the elements, particularly moisture and environmental pollutants. In general, the pottant should possess good structural properties at both high summer temperature extremes and cold winter temperature extremes to accommodate expansion and contraction of the cell and adjacent material in the composite roofing membrane without allowing delamination of any of the layers. Thus, it is desirable that the pottant match the thermal coefficient of expansion of the adjacent materials over a wide range. In addition, the pottant has to be transparent so that it doesn't absorb solar radiation in a significant amount. Examples of suitable pottants include EVA, and the elastomeric pottants EPDM and polyurethane (clear cast, solvent dispersed).

Additional elastomeric pottants include ethylmethyl acrylate and poly-n-butyl-acrylate.

Of the above mentioned materials, EVA is most suitable, having a favorable melting/softening temperature of about 140° C. and is capable of encapsulating and bonding the solar cell layer into the structure without air bubbles to form a consolidated bubble-free structure.

The material of cover layer 14 is selected primarily to provide for durability upon exposure to the elements. In general, the cover has to be flexible and transparent, being over 90% transmissive to solar radiation and also does not absorb solar radiation. By durable is meant that it is capable of resisting the elements for 20 to 30 years. This implies that it must be highly weatherproof, moistureproof, impact resistant, reasonably thin and usable in the automated fabrication procedures for assembly of the combination roofing.

Examples of such materials include Tedlar, a PVF, which is very dirt resistant, has excellent weather resistance properties and is impervious to moisture. Another material includes Kynar, a poly-vinylidene fluoride having low dirt affinity and also excellent weather resistance. These materials typically have a melting point in excess of 300° C., and are strong enough that they need not be made thick, but can be formed as an independent coating layer and placed over the intermediate layer 12 of potting.

Additional material suitable for the cover layer 14 include the flexible plexiglasses DR-61K and V-811 from Rohn & Haas.

EXAMPLE I

A base layer 10 was formed of flexible single-ply roofing membrane PVC sold under the trade designation Sucoflex by PMS/Sucoflex of Torrance, Calif. This membrane is a fused sandwich of carbon black filled PVC as a base layer with a grey PVC cover layer between which is disposed a non-woven fiberglass reinforcing layer. The intermediate layer 12 is EVA: the cover layer 14 is PVF (Tedlar). Layers 10, 12, and 14 will be fused together to form a unitary membrane. The solar cell construction is shown in particular in FIGS. 1 and 2 and consists of a plurality of crystalline silicon cells which are arranged in an ordered array having rows 22a, 22b, 22c, and columns 23a, 23b, 23c with spaces 32, 34 across the width of the structure so that it can be flexed in the spaces. Additionally, the spaces are provided with a pair of depression grooves 32a, 34a which further facilitates bending (see FIGS. 2 and 3). For practical reasons the pottant layer can comprise two individual layers between which is laid the photovoltaic solar cell construction after which the cover layer is placed on top. The EVA plastic has a lower thermoplastic softening point than either the base layer or the cover layer so that it will soften/melt and adhere to these layers and form a lamination with them with suitable processing. Typically processing incudes an autoclave heating of the assembled elements to a temperature above the softening point, i.e. slightly above 140° C. for EVA for a period of about 30 minutes so that full bonding and lamination between the layers can take place. The lamination can be vacuum debulked prior to autoclaving to assure the elimination of bubbles.

In one example of this construction, the thicknesses of the layers were as follows: PVC base layer 10, 47 mil; EVA layer 12, 10 mil each; photovoltaic cell, 450 to 500 microns; and cover layer 14, 4 mils. A continuous run of roofing material of the type given in this example could be made to an arbitrary length in the same manner as is done in the continuous web manufacture of nylon sheet.

EXAMPLE II

Thin film photovoltaic cells are formed on a flexible substrate, e.g. metal foil, and then laminated onto a flexible PVC base layer. The cells are selected from one of the materials a-Si, CdTe/CdS, and CuInSe$_2$/CdS.

The following is an availability table for exemplar roofing membranes of each class of materials suitable for use in the present invention.

FIG. 4 shows a current/voltage plot for a roofing constructed in accordance with the invention based on the following particulars:

Irradiation (insolation): 100 milliwatt/cm$^2$
Temperature: 20° C.
Voltage, at open circuit: 11.47 volts
Current, at short circuit: 0.98 amp
Voltage at max power: 8.69 volts.

EXAMPLES FOR SINGLE-PLY ROOFING MEMBRANES

| A. MODIFIED BITUMENOUS | |
|---|---|
| 1   Barrett Company<br>     901 Washington St.<br>     Wilmington, DE 19801 | Product Name:<br>RAM 2000-Cariphalte |

-continued

| | | |
|---|---|---|
| 2 | Flex-Shield International<br>P.O. Box 1790<br>686 West Commerce<br>Gilbert, AZ 85284 | Product Name:<br>Flex Shield Mark |
| 3 | Villas Roofing Systems<br>Riverbridge Industrial Centra<br>Front and Lloyd Streets<br>Chester, PA 19013 | Product Name:<br>Villaplast<br>Villaflex |
| B. THERMOPLASTIC | | |
| 1 | Duro-Last Roofing | Product Name:<br>Duro-Last Copolymer |
| 2 | Alkor Company<br>1 Blue Hill Plaza<br>Pearl River, NY 10965 | Product Name:<br>Alkorplex PVC |
| 3 | Sarnafil, Inc.<br>100 Dan Road<br>Canton, MA 02021 | Product Name:<br>Sarnafil PVC |
| C. ELASTOMERIC<br>(Rubber and Rubber-like) | | |
| 1 | Carlisle Syntec Systems<br>P.O. Box 7000<br>Carlisle, PA 17013<br>- vulcanized | Product Name:<br>Surseal MARS<br>(EPDM) |
| 2 | Diversitech General<br>Building Systems Division<br>P.O. Box 875<br>Toledo, OH 43696-0875 | Product Name:<br>Genseal<br>- vulcanized |
| 3 | Goodyear Tire & Rubber Co.<br>1144 East Market Street<br>Akron, OH 44316 | Product Name:<br>Versigard<br>- vulcanized |
| D. NON-VULCANIZED ELASTOMERS | | |
| 1 | Dunlop Construction<br>Toronto, Canada | Product Name:<br>Dunseal (CSPE)<br>- non-vulcanized |
| 2 | Bond Cote System<br>West Point, Georgia | Product Name:<br>Bond Grey 35 (NBP)<br>-non-vulcanized<br>-acrylonitrite<br>butadiene<br>polymer |
| 3 | J. P. Stevens<br>Easthampton, Massachusetts | Product Name:<br>Hi-Tuff (CSPE) |

What is claimed is:

1. A prefabricated multi-functional roofing system formed in elongated flexible sections of substantially uniform thickness constructed for being rolled up in lengths suitable for being transported to a building site for unrolling and for being affixed to a roof structure, comprising:
   means forming an elongate section of flat, flexible single-ply roofing membrane adapted to extend over a said roof structure;
   said roofing membrane having a top side for exposure to the elements and being heat reflective and a bottom side for being placed on a roof substrate of said roof structure to form a roof thereon, said membrane having a predetermined softening temperature, and further including a fibrous material for reinforcing said membrane over a wide range of temperatures;
   means forming a plurality of photovoltaic cells distributed in a two dimensional flat array of rows and columns arranged continuously over said membrane;
   electrical circuiting means for interconnecting said photovoltaic cells and for extracting electrical power therefrom, said circuiting means comprising a plurality of bus bars;
   means forming a flat flexible thermoplastic pottant layer extending above and below said cells and over the area of said membrane to thereby mount, cover, and adhere said cells and circuiting means over the top side of the membrane in a predetermined pattern and to encapsulate the cells in a structure sufficiently flexible to be rolled up, said pottant layer having a second predetermined softening temperature and having a thermal coefficient of expansion compatible with said roofing system;
   a flexible cover layer adhered on top of said roofing membrane, pottant layer, and photovoltaic cells, said cover layer being transparent, tough and weatherproof, and having a softening temperature higher than said pottant layer;
   said membrane and said cover layer having predetermined first and second softening temperatures and said pottant layer havaing a third softening temperature lower than said first and second softening temperatures;
   said membrane, pottant layer, and cover layer being assembled and joined into a composite structure by heating above the softening temperature of said pottant layer but below the softening temperature of said membrane and said cover layer to thereby fuse and adhere the layers together for forming said roofing system adapted to conform to said roof structure of any shape; and
   means for flexing associated with each of said layers for keeping said composite flexible enough to roll up, said flexing means including transversely extending space channels formed between adjacent columns of said array of photovoltaic cells and depression grooves formed within each of said space channels.

2. The roofing system as in claim 1 wherein said photovoltaic cells are formed of rigid photovoltaic material of relatively small dimensions and interconnected by a plurality of wires.

3. The roofing system as in claim 1 wherein said single ply roofing membrane is a flexible waterproof base membrane, and a top side layer is constructed especially to withstand exposure to the elements and damage from sunlight.

4. The roofing system as in claim 3 wherein said photovoltaic cells are formed of rigid photovoltaic material of relatively small dimensions and interconnected by a plurality of wires.

5. A prefabricated multi-functional roofing system formed in sections having uniform thickness and extending over a substantial area and formed to be flexible so as to be rolled up in lenghts suitable for being transported to a building site for unrolling and bonding together in side by side relation to complete a roof structure, comprising:
   means forming a flexible single-ply roofing membrane layer adapted to extend over said area;
   means forming a plurality of solar cells distributed in a two dimensional array continuously over said area, said array having a plurality of transversely extending space channels between adjacent groups of solar cells and including depression grooves formed therein for permitting rolling up and unrolling of said array;
   means interconnecting said cells to enable generation of a predetermined voltage and current therefrom;
   means forming a pottant layer extending above and below said cells and throughout said area to thereby encapsulate the cells into a structure sufficiently flexible to be rolled up, said pottant layer having a thermal coefficient of expansion compatible with said roofing system; and means forming a transparent protective layer extending throughout said area on top of said pottant layer, said pottant layer integrating the layers into a unitary assembly by fusing them together into a flexible system under heat, said roofing system adatped to conform to said roof structure of any shape.

6. A prefabricated multi-functional roofing system formed in sections having uniform thickness over a substantial planar area and formed in flexible sections constructed for being rolled up in lengths suitable for being transported to a building site for unrolling and bonding together in side by side relation to complete a roof structure, comprising:

means forming a section of flat, flexible single-ply roofing membrane adapted to extend over said area;

menas forming a plurality of photovoltaic cells distributed in a two dimensional flat array continuously over said area, said array having a plurality of transversely extending space channels between adjacent groups of photovoltaic cells for permitting rolling up and unrolling of said arrray, said space channels further comprising depression grooves formed therein;

wiring means interconnecting said cells for enabling generation of a predetermined voltage and current therefrom;

means forming a flat pottant layer extending above and below said cells and over the area of said section for encapsulating the cells into a structure sufficiently flexible to be rolled up, said pottant layer having a thermal coefficient of expansion compatible with said roofing system; and means for forming a flat transparent protective cover layer extending throughout said area on top of said pottant layer, said roofing system being integrated into a unitary assembly by heating the several layers to cause the pottant layer to fuse the single-ply roofing membrane, said plurality of photovoltaic cells, said wiring means, and said cover layer together into a flexible section of said roofing system adapted to conform to said roof structure of any shape.

7. A prefabricated multi-functional roofing system formed in elongated flexible sections of substantially uniform thickness constructed for being rolled up in lengths suitable for being transported to a building site for unrolling and for being affixed to a roof structure, comprising:

a roof substrate formed within said roof structure;

means for forming an elongate section of flat, flexible single-ply roofing membrane extending over said roof substrate;

said roofing membrane having a top side for exposure to the elements and being heat reflective and a bottom side for being placed on said roof substrate to form a roof thereon, said membrane having a predetermined softening temperature, and further including a fibrous material for reinforcing said membrane over a wide range of temperatures;

means for forming a plurality of photovoltaic cells distributed in a two dimensional flat array continuously over said membrane, said array having a plurality of transversely extending space channels between adjacent groups of said photovoltaic cells for permitting rolling up and unrolling of said array, each of said space channels including a depression groove formed therein;

electrical circuiting means for interconnecting said photovoltaic cells and for extracting electrical power therefrom, said circuiting means comprising a plurality of bus bars;

means forming a flat flexible thermoplastic pottant layer extending above and below said cells and over the area of said membrane to thereby mount, cover, and adhere said cells and circuiting means over the top side of the membrane in a predetermined pattern and to encapsulate the cells in a structure sufficiently flexible to be rolled up, said pottant layer having a second predetermined softening temperature and having a thermal coefficient of expansion compatible with said roofing system;

a flexible cover layer adhered on top of said roofing membrane, pottant layer, and photovoltaic cells, said cover layer being transparent, tough and weatherproof, and having a softening temperature higher than said pottant layer;

said membrane and said cover layer having predetermined first and second softening temperatures and said pottant layer having a third softening temperature lower than said first and second softening temperatures; and;

said membrane, pottant layer, and cover layer being assembled and joined into a composite structure by heating above the softening temperature of said pottant layer but below the softening temperature of said membrane and said cover layer to thereby fuse and adhere the layers together for forming said roofing system adapted to conform to said roof structure of any shape.

* * * * *